(12) United States Patent
Huang et al.

(10) Patent No.: US 11,171,085 B2
(45) Date of Patent: Nov. 9, 2021

(54) SEMICONDUCTOR DEVICE STRUCTURE WITH MAGNETIC LAYER AND METHOD FOR FORMING THE SAME

(71) Applicant: Taiwan Semiconductor Manufacturing Co., Ltd., Hsinchu (TW)

(72) Inventors: Hon-Lin Huang, Hsinchu (TW); Wei-Li Huang, Pingtung (TW); Chun-Kai Tzeng, Tainan (TW); Cheng-Jen Lin, Kaohsiung (TW); Chin-Yu Ku, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 202 days.

(21) Appl. No.: 16/222,107

(22) Filed: Dec. 17, 2018

(65) Prior Publication Data
US 2019/0355660 A1 Nov. 21, 2019

Related U.S. Application Data

(60) Provisional application No. 62/673,207, filed on May 18, 2018.

(51) Int. Cl.
*H01L 23/522* (2006.01)
*H01L 23/528* (2006.01)
*H01L 49/02* (2006.01)
*H01L 23/532* (2006.01)

(52) U.S. Cl.
CPC ...... *H01L 23/5227* (2013.01); *H01L 23/5283* (2013.01); *H01L 23/53295* (2013.01); *H01L 28/10* (2013.01)

(58) Field of Classification Search
CPC ............... H01L 28/10; H01L 23/5283; H01L 23/53295; H01L 23/5227; H01L 24/03; H01L 24/05; H01L 24/11; H01L 24/13; H01L 2224/0401; H01L 2224/05082
See application file for complete search history.

(56) References Cited

U.S. PATENT DOCUMENTS 3,891,995 A * 6/1975 Hanazono ............... G11B 5/313
360/123.01
4,752,850 A * 6/1988 Yamada ................... G11B 5/31
360/121
4,819,112 A * 4/1989 Iwata ................... G11B 5/3163
360/119.11

(Continued)

*Primary Examiner* — Michael M Trinh
(74) *Attorney, Agent, or Firm* — McClure, Qualey & Rodack, LLP

(57) ABSTRACT

A semiconductor device structure is provided. The semiconductor device structure includes a substrate, and the substrate includes a first region and a second region. The semiconductor device structure includes a first conductive structure formed over the first region of the substrate and a bottom magnetic layer formed over the second region of the substrate. The semiconductor device structure also includes a second conductive structure formed over the bottom magnetic layer and a first insulating layer formed over a sidewall surface of the first conductive structure. The semiconductor device structure further includes a second insulating layer formed over the first insulating layer, and the second insulating layer has a stair-shaped structure.

20 Claims, 10 Drawing Sheets

(56) References Cited

U.S. PATENT DOCUMENTS

| | | | | | |
|---|---|---|---|---|---|
| 5,065,270 | A | * | 11/1991 | Koyanagi | G11B 5/31 |
| | | | | | 360/123.41 |
| 5,870,262 | A | * | 2/1999 | Ikegawa | G11B 5/3967 |
| | | | | | 360/123.25 |
| 6,631,550 | B2 | * | 10/2003 | Sasaki | B82Y 25/00 |
| | | | | | 29/603.13 |
| 9,406,632 | B2 | * | 8/2016 | Wang | H01L 23/3128 |
| 2001/0053045 | A1 | * | 12/2001 | Ishiwata | G11B 5/3146 |
| | | | | | 360/123.22 |
| 2008/0003760 | A1 | * | 1/2008 | Gardner | H01F 41/34 |
| | | | | | 438/381 |
| 2008/0157910 | A1 | * | 7/2008 | Park | H01L 23/5227 |
| | | | | | 336/110 |
| 2008/0238602 | A1 | * | 10/2008 | Schrom | H01F 17/0006 |
| | | | | | 336/84 M |
| 2016/0149122 | A1 | * | 5/2016 | Sullivan | H01L 43/12 |
| | | | | | 438/3 |
| 2018/0034369 | A1 | * | 2/2018 | Deligianni | H01L 21/7624 |
| 2018/0204902 | A1 | * | 7/2018 | Huang | H01L 27/222 |

* cited by examiner

SEMICONDUCTOR DEVICE STRUCTURE WITH MAGNETIC LAYER AND METHOD FOR FORMING THE SAME

CROSS REFERENCE TO RELATED APPLICATIONS

This application claims the benefit of U.S. Provisional Application No. 62/673,207, filed on May 18, 2018, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

Inductors may be utilized in a wide variety of applications. One such application of an inductor may be as a choke, in which an inductor is designed to have a high inductive reactance to, or block, signals at certain frequencies in an electrical circuit while allowing passage of other signals at different frequencies in the electrical circuit. However, there are many challenges in forming the inductor.

Although existing package structures and methods of fabricating package structures have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
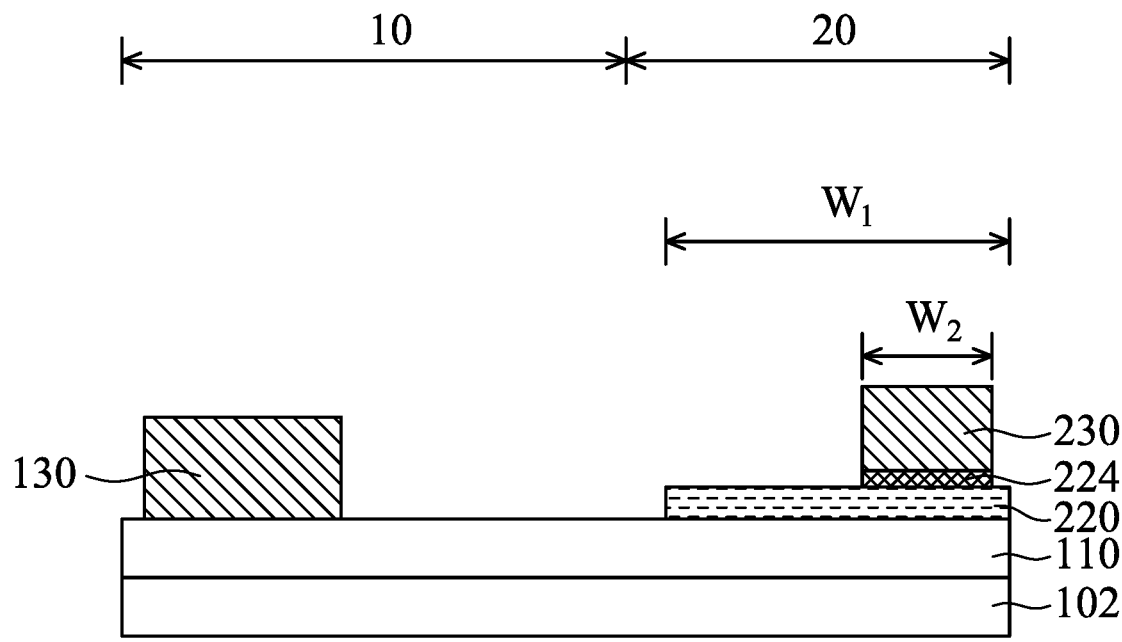
FIGS. 1A-1K show cross-sectional representations of various stages of forming a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a package structure and method for forming the same are provided. FIGS. 1A-1K show cross-sectional representations of various stages of forming a semiconductor device structure 100, in accordance with some embodiments of the disclosure. In some embodiments, the semiconductor device structure is an inductor structure. The inductor structure includes an electrical conductor encircled by the magnetic materials. In some embodiments, the electrical conductor is a conductive structure, and the magnetic materials are constructed by the top magnetic layer and the bottom magnetic layer.

As shown in FIG. 1A, a substrate 102 is provided, in accordance with some embodiments of the disclosure. The substrate 102 includes a first region 10 and a second region 20. In some embodiments, the first region 10 is a peripheral region which is used to transfer signal, and the second region 20 is a central region which is used to form the main active device. The first region 10 may be referred to as a non-dome region and the second region 20 may be called a dome region. In some embodiments, an inductor may be formed in the dome region, and a connector structure may be formed in the non-dome region.

The substrate 102 may be made of silicon (Si) or another semiconductor material, such as germanium (Ge). In some embodiments, the substrate 102 is a substrate of a device die. In some embodiments, the substrate 102 is made of a compound semiconductor such as silicon carbide, gallium arsenic, indium arsenide, or indium phosphide. In some embodiments, the substrate 102 is made of semiconductor material, ceramic material, polymer material, metal material, another applicable material or a combination thereof. In some embodiments, the substrate 102 is a glass substrate. In some embodiments, the substrate 102 is a semiconductor substrate, such as silicon wafer.

The device elements (not shown) are formed on the substrate 102. The device elements (not shown) include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements 104, such as deposition, etching, implantation, photolithography, annealing, and/or other applicable processes. In some embodiments, device elements are formed in the substrate 102 in a front-end-of-line (FEOL) process.

The substrate 102 may include various doped regions such as p-type wells or n-type wells. Doped regions may be doped with p-type dopants, such as boron or $BF_2$, and/or n-type dopants, such as phosphorus (P) or arsenic (As). The doped regions may be formed in or on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

In some embodiments, an interconnect structure 110 is formed over the substrate 102. In some embodiments, the interconnect structure 110 is embedded in inter-metal dielectric (IMD) layers. The interconnect structure 110 includes metal lines, contacts (not shown) and via features (not shown). The metal lines provide horizontal electrical routing. The contacts provide vertical connection between the substrate 102 and metal lines while via features provide vertical connection between metal lines in different metal layers.

Afterwards, in the first region 10 of the substrate 102, a first conductive structure 130 is formed over the substrate 102. In some embodiments, the first conductive structure 130 is made of a metal layer, such as copper (Cu), copper alloy, nickel (Ni), nickel alloy, aluminum (Al), aluminum alloy, tin (Sn), tin alloy, lead (Pb), lead alloy, silver (Ag), silver alloy or a combination thereof. In some embodiments, the first conductive structure 130 is made of copper. In some embodiments, the first conductive structure 130 is formed by a deposition process, such as an electroplating process, a physical vapor deposition (PVD) process, a chemical vapor deposition (CVD) process, or another applicable process.

In the second region 20 of the substrate 102, a bottom magnetic layer 220 is formed over the interconnect structure 110, and a first dielectric layer 224 is formed over the bottom magnetic layer 220. Next, a second conductive structure 230 is formed over the first dielectric layer 224. The second conductive structure 230 is isolated from the bottom magnetic layer 220 by the first dielectric layer 224. A magnetic field is induced when an electrical current flows through the second conductive structure 230. The induced magnetic field is used to magnetize the bottom magnetic layer 220 and the top magnetic layer 250 (formed later, FIG. 1F).

The bottom magnetic layer 220 is configured for use as part of an inductor structure. The bottom magnetic layer 220 is made of cobalt (Co), zirconium (Zr), tantalum (Ta) and niobium (Nb), rhenium (Re), neodymium (Nd), praseodymium (Pr), or dysprosium (Dy). In some embodiments, the top magnetic layer 220 is made of an amorphous cobalt (Co) alloy including cobalt (Co) and zirconium (Zr). In some embodiments, the bottom magnetic layer 220 is made of a cobalt-zirconium (CoZr) alloy having one or more additional elements, such as tantalum (Ta) and niobium (Nb). In some other embodiments, the bottom magnetic layer 220 is made of a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the bottom magnetic layer 220 is formed by a plating process, such as an electrochemical plating process or an electroless process.

The bottom magnetic layer 220 has a first width $W_1$ in the horizontal direction, and the second conductive structure 230 has a second width $W_2$ in the horizontal direction. The first width $W_1$ of the bottom magnetic layer 220 is greater than the second width $W_2$ of the second conductive structure 230. The bottom magnetic layer 220 is not physically connected to a top magnetic layer 250 (formed later, in FIG. 1F), but is magnetically connected to the top magnetic layer 250 (formed later, in FIG. 1F) to form a closed loop. The bottom magnetic layer 220 and the top magnetic layer 250 (formed later, in FIG. 1F) surround the second conductive structure 230. In some embodiments, the first width $W_1$ of the bottom magnetic layer 220 is in a range from about 100 μm to about 200 μm. In some other embodiments, the second width $W_2$ of the second conductive structure 230 is in a range from about 50 μm to about 80 μm. In some embodiments, a ratio of the second width $W_2$ to the first width $W_1$ is in a range from about ¼ to about ½. When the ratio of the second width $W_2$ to the first width $W_1$ is within the above-mentioned range, the performance of the inductor structure is better induced and the inductor structure has a better saturation current control.

The first dielectric layer 224 is made of an insulating material to isolate the bottom magnetic layer 220 and the second conductive structure 230. The first dielectric layer 224 is made of silicon oxide (SiOx), silicon nitride (SixNy), silicon oxynitride (SiON), or another dielectric material. In some embodiments, the first dielectric layer 224 is made of silicon nitride (SiN). In some embodiments, the first dielectric layer is formed by a deposition process, such as a physical vapor deposition (PVD) process, a chemical vapor deposition (CVD) process, or another applicable process.

The top surface of the second conductive structure 230 in the second region 20 is higher than the top surface of the first conductive structure 130 in the first region 10. In some embodiments, the second conductive structure 230 is made of a metal layer, such as copper (Cu), copper alloy, nickel (Ni), nickel alloy, aluminum (Al), aluminum alloy, tin (Sn), tin alloy, lead (Pb), lead alloy, silver (Ag), silver alloy or a combination thereof. In some embodiments, the first conductive structure 130 and the second conductive structure 230 both are made of the same material, such as copper. In some other embodiments, the first conductive structure 130 and the second conductive structure 230 are made of different materials. For example, the first conductive structure 130 is made of copper, and the second conductive structure 230 is made of aluminum (Al). In some embodiments, the first conductive structure 130 is formed by a plating process, CVD process, PVD process or another applicable process.

Figure 1B:
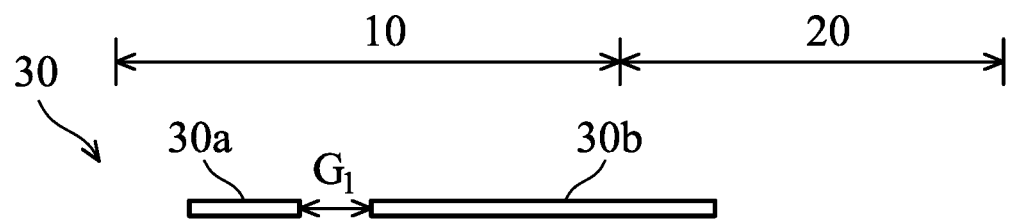
Figure 1B:
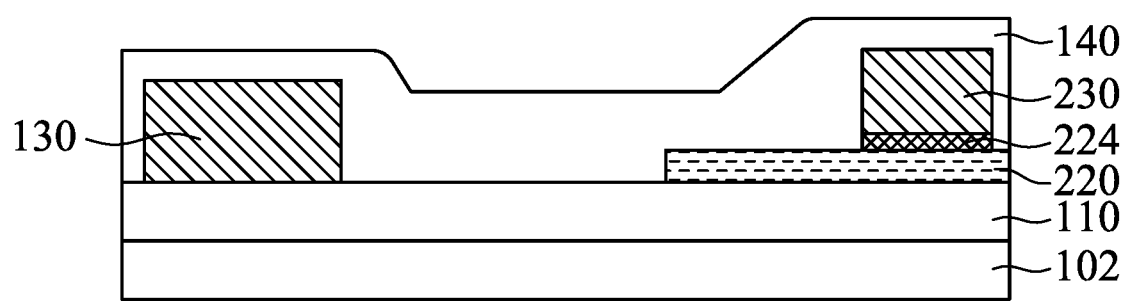

Afterwards, as shown in FIG. 1B, a first insulating layer 140 is formed over the first conductive structure 130, the second conductive structure 230, and the bottom magnetic layer 220, in accordance with some embodiments of the disclosure. The first insulating layer 140 is formed over the interconnect structure 110, first conductive structure 130, the second conductive structure 230, and the bottom magnetic layer 220, and therefore the top surface of the first insulating layer is uneven.

The first insulating layer 140 is made of polybenzoxazole (PBO), benzocyclobutene (BCB), polyimides (PI), silicone, acrylates, siloxane, or a combination thereof. In some embodiments, the first insulating layer 140 is made of polyimides (PI). In some other embodiments, the first insulating layer 140 is formed by a deposition process, such as a physical vapor deposition (PVD) process, a chemical vapor deposition (CVD) process, or another applicable process.

Next, a first mask 30 is disposed over first insulating layer 140. The first mask 30 is configured for use as a mask for the following photolithography process. The first mask 30 includes a first portion 30a and a second portion 30b. There is a first gap $G_1$ between the first portion 30a and the second portion 30b of the first mask 30. The first gap $G_1$ may affect the pattern of the patterned first insulating layer 140 (formed later). In some embodiments, the first gap $G_1$ is in a range from about 10 µm to about 40 µm.

Figure 1C:
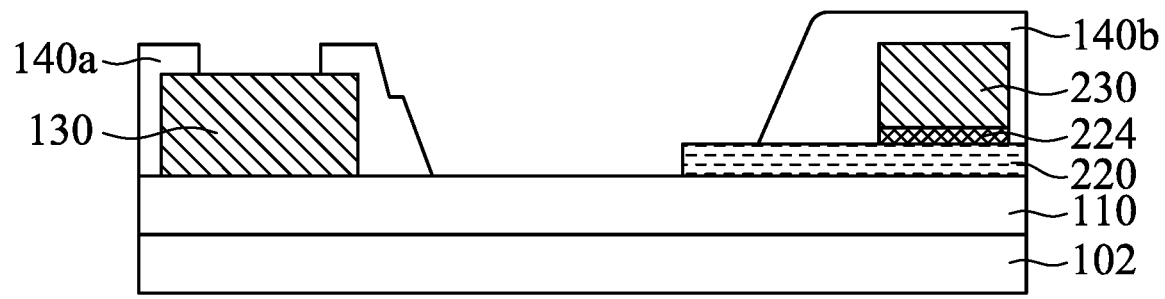

Afterwards, as shown in FIG. 1C, the first insulating layer 140 is patterned to form the patterned first insulating layer 140, in accordance with some embodiments of the disclosure. In some embodiments, the unexposed region of the first insulating layer 140 is removed by a developer, but the exposed region of the first insulating layer 140 is left. As a result, the first insulating layer 140 includes a first portion 140a in the first region 10 and a second portion 140b in the second region 20.

The first insulating layer 140 is patterned by performing a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

In the first region 10, a portion of the top surface of the first conductive structure 130 is exposed by the first portion 140a of the first insulating layer 140. A portion of the first portion 140a which is on sidewall surfaces of the first conductive structure 130 has a sloped sidewall. In some embodiments, the sloped sidewall of the first portion 140a has two different slopes. More specifically, the right sidewall of the first portion 140a of the first insulating layer 140 has stair-shaped structure due to the design of the first mask 30. The first gap $G_1$ affects the pattern of the patterned first insulating layer 140. The first gap $G_1$ corresponds to the stair-shaped location of the first insulating layer 140. The right sidewall of the first portion 140a of the first insulating layer 140 is closer to the second region 20 than the left sidewall is.

In the second region 20, a portion of the top surface of the bottom magnetic layer 220 is exposed. All surfaces of the second conductive structure 230 are covered by the second portion 140b of the first insulating layer 140.

Figure 1D:
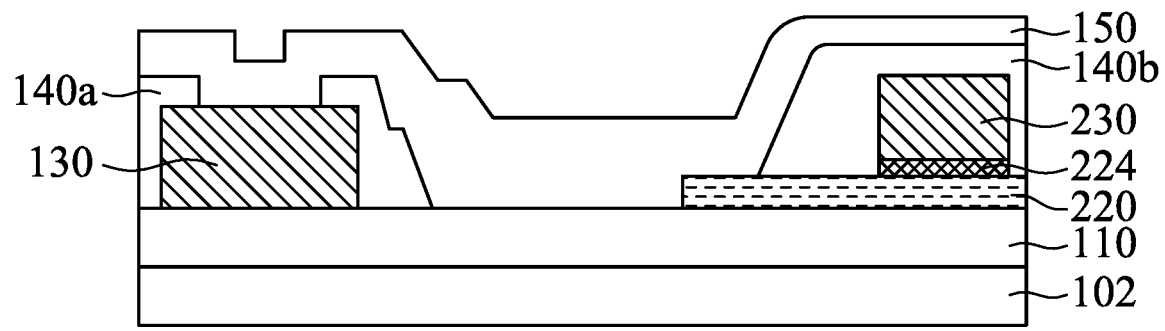

Subsequently, as shown in FIG. 1D, a second insulating layer 150 is formed over the first insulating layer 140, in accordance with some embodiments of the disclosure.

In some embodiments, the first insulating layer 140 and the second insulating layer 150 are made of different materials. When the first insulating layer 140 and the second insulating layer 150 are made of different materials, the interface between the first insulating layer 140 and the second insulating layer 150 can be observed using an electron microscope, such as a scanning electron microscope (SEM).

In some embodiments, the second insulating layer 150 is made of polybenzoxazole (PBO), benzocyclobutene (BCB), polyimides (PI), silicone, acrylates, siloxane, or a combination thereof. In some other embodiments, the second insulating layer 150 is formed by a deposition process, such as a physical vapor deposition (PVD) process, a chemical vapor deposition (CVD) process, or another applicable process. In some embodiments, the second insulating layer 150 has a thickness in a range from about 2 um to about 8 um.

If the thickness of the second insulating layer 150 is too large, a high photoresist layer 255 have to deposited to cover all of the second insulating layer 150. More photoresist layer 255 is deposited, and more photoresist layer 255 in the first region 10 is removed. However, the bottom portion of the photoresist layer 255 may not easily to be removed and may produce some bubbles in the bottom portion. The bubbles come from outgas generated from photoresist material when the photoresist layer is exposed to light. If the thickness of the second insulating layer 150 is too small, the second insulating layer 150 is not easily to cover first portion 140a and second portion 140b of the first insulating layer 140. It induces insulating poor coverage and poor coating issue.

Next, a second mask 40 is disposed over the second insulating layer 150. The second mask 40 is configured for use as a mask for the following photolithography process. The second mask 40 includes a first portion 40a and a second portion 40b. There is a second gap $G_2$ between the first portion 40a and the second portion 40b of the second mask 40. The second gap $G_2$ may affect the pattern of the patterned second insulating layer 150. In some embodiments, the second gap $G_2$ is greater than the first gap $G_1$. In some embodiments, the second gap $G_2$ is in a range from about 35 um to about 75 um. If the second gap $G_2$ is too large, the space between first portion 140a and the second portion 140b of the first insulating layer 140 is too small and may induce process defect increasing. If the second gap $G_2$ is too small, the slop profile cannot meet smaller angle. It should be noted that the second gap $G_2$ of the second mask 40 and the deposited thickness of the second insulating layer 150 should be well controlled to obtain the sidewall of the second insulating layer 150 with the stair-shaped structure. If the deposited thickness of the second insulating layer 150 is too large, it would be difficult to form the stair-shaped structure.

Figure 1E:
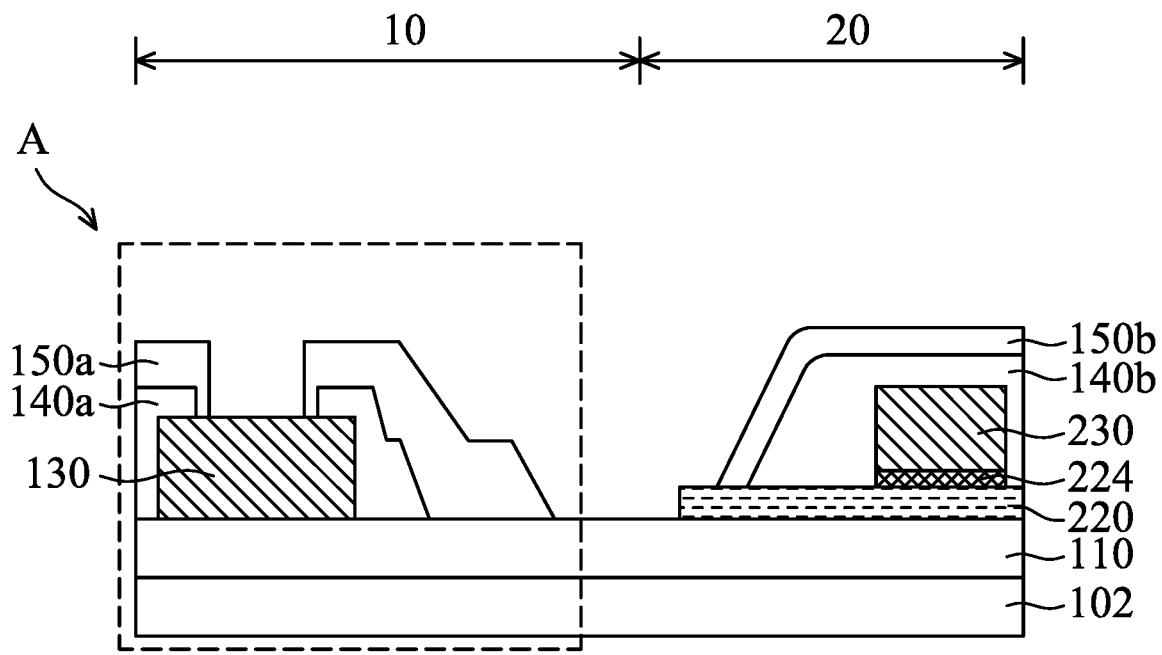

Subsequently, as shown in FIG. 1E, the second insulating layer 150 is patterned to form a patterned second insulating layer 150, in accordance with some embodiments of the disclosure. Therefore, the patterned second insulating layer 150 includes a first portion 150a in the first region 10 and a second portion 150b in the second region 20. As mentioned above, the pattern of the patterned second insulating layer 150 is formed by controlling the second gap $G_2$ of the second mask 40, and the deposition thickness of the second insulating layer 150. In some embodiments, the first portion 150a of the patterned second insulating layer 150 has a stair-shaped structure with at least two levels. In addition, the interface between the first insulating layer 140 and the second insulating layer 150 also has a stair shape.

In the first region 10, a portion of the top surface of the first conductive structure 130 is exposed by the first portion 150a of the second insulating layer 150. The sidewall of the first portion 150a which is on sidewall of the first conductive structure 130 has two levels. In some embodiments, the sloped sidewall of the first portion 150a of the second insulating layer 150 has two different slopes. More specifically, the right sidewall of the first portion 150a of the second insulating layer 150 has stair-shaped structure due to the design of the second mask 40. In some embodiments, the left sidewall of the first portion 150a of the second insulating layer 150 has another stair-shaped structure which is symmetric to the right sidewall of the first portion 150a. The right sidewall of the first portion 150a of the second insulating layer 150 is closer to the second region 20 than the left sidewall of that.

Figure 2:
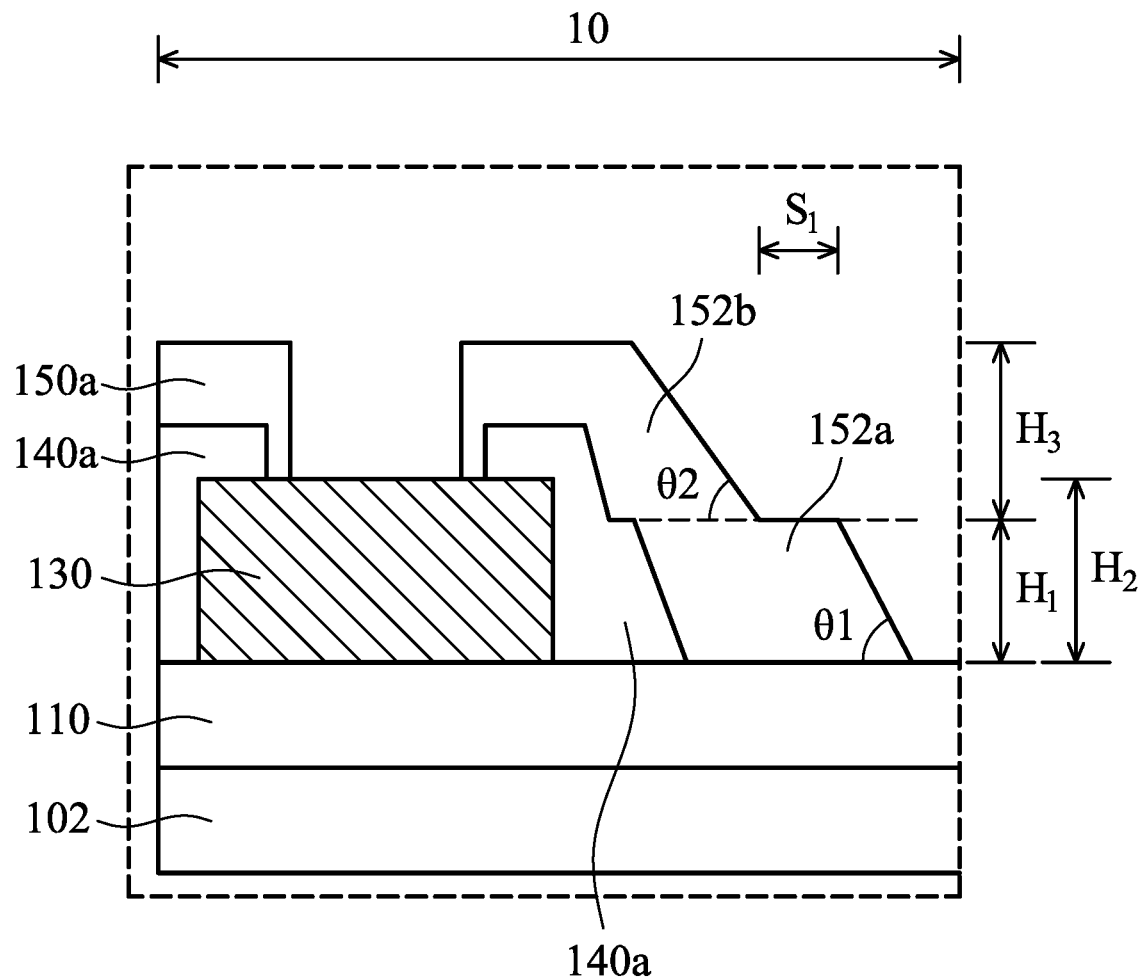
FIG. 2 shows an enlarged cross-sectional representation of the region A of FIG. 1E, in accordance with some embodiments of the disclosure.

FIG. 2 shows an enlarged cross-sectional representation of the region A of FIG. 1E, in accordance with some embodiments of the disclosure.

As shown in FIG. 2, the second insulating layer 150 has a stair-shaped structure. The right sidewall of the second insulating layer 150 includes a bottom portion 152a and a top portion 152b. There is a substantially planar top surface of the bottom portion 152a. In some embodiments, the substantially planar top surface of the bottom portion 152a has a width $S_1$ in a range from about 10 μm to about 40 μm.

The bottom portion 152a and the top portion 152b have different slopes. The bottom portion 152a is sloped to the top surface of the interconnect structure 110. A first angle $\theta_1$ is between the top surface of the interconnect structure 110 and the outer sidewall of the bottom portion 152a. A second angle $\theta_2$ is between the top surface of the interconnect structure 110 and the outer sidewall of the top portion 152b. The first angle $\theta_1$ is greater than the second angle $\theta_2$. In some embodiments, the first angle $\theta_1$ is in a range from about 20 degrees to about 65 degrees. In some embodiments, the second angle $\theta_2$ is in a range from about 5 degrees to about 40 degrees.

The bottom portion 152a has a first height $H_1$ which is measured from the top surface of the interconnect structure 110 to the top surface of the bottom portion 152a. The first conductive structure 130 has a second height $H_2$ which is measured from the top surface of the interconnect structure 110 to the top surface of the first conductive structure 130. The top portion 152b has a third height $H_3$ which is measured from the top surface of the bottom portion 152a to the top surface of the top portion 152b. In some embodiments, the first height $H_1$ is in a range from about 5 μm to about 15 μm. In some embodiments, the second height $H_2$ is in a range from about 5 μm to about 10 μm. In some embodiments, a ratio of the first height $H_1$ to the second height $H_2$ is in a range from about ½ to about 3.

Figure 1F:
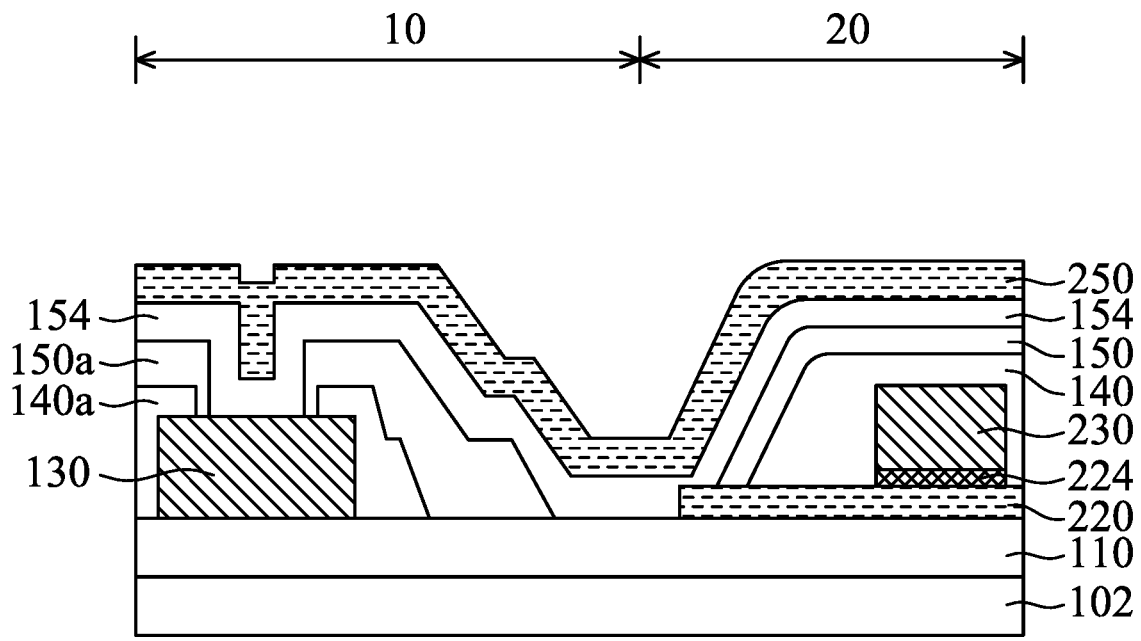

Afterwards, as shown in FIG. 1F, a second dielectric layer 154 is formed over the second insulating layer 150 and the exposed top surface of the interconnect structure 110, in accordance with some embodiments of the disclosure. Next, a top magnetic layer 250 is formed over the second dielectric layer 154. The second conductive structure 230 is surrounded or encircled by the top magnetic layer 250 and the bottom magnetic layer 220. The top magnetic layer 250 is configured for use as part of an inductor structure. The top magnetic layer 250 is insulated from the bottom magnetic layer 220 from the second dielectric layer 154. The top magnetic layer 250 is magnetically connected to the bottom magnetic layer 220 to form a closed loop of the inductor structure.

The top magnetic layer 250 and the bottom magnetic layer 220 may be made of the same materials. The top magnetic layer 250 is made of cobalt (Co), zirconium (Zr), tantalum (Ta) and niobium (Nb), rhenium (Re), neodymium (Nd), praseodymium (Pr), or dysprosium (Dy). In some embodiments, the top magnetic layer 250 is made of an amorphous cobalt (Co) alloy including cobalt (Co) and zirconium (Zr). In some embodiments, the top magnetic layer 250 is made of a cobalt-zirconium (CoZr) alloy having one or more additional elements, such as tantalum (Ta) and niobium (Nb). In some other embodiments, the top magnetic layer 250 is made of a cobalt-zirconium (CoZr) alloy having one or more additional elements, such as a rare earth element, that help increase the ferromagnetic resonance of the cobalt-zirconium (CoZr) alloy. Rare earth elements include rhenium (Re), neodymium (Nd), praseodymium (Pr), or dysprosium (Dy). In some embodiments, the top magnetic layer 250 is formed by a plating process, such as an electrochemical plating process or an electroless process.

Figure 1G:
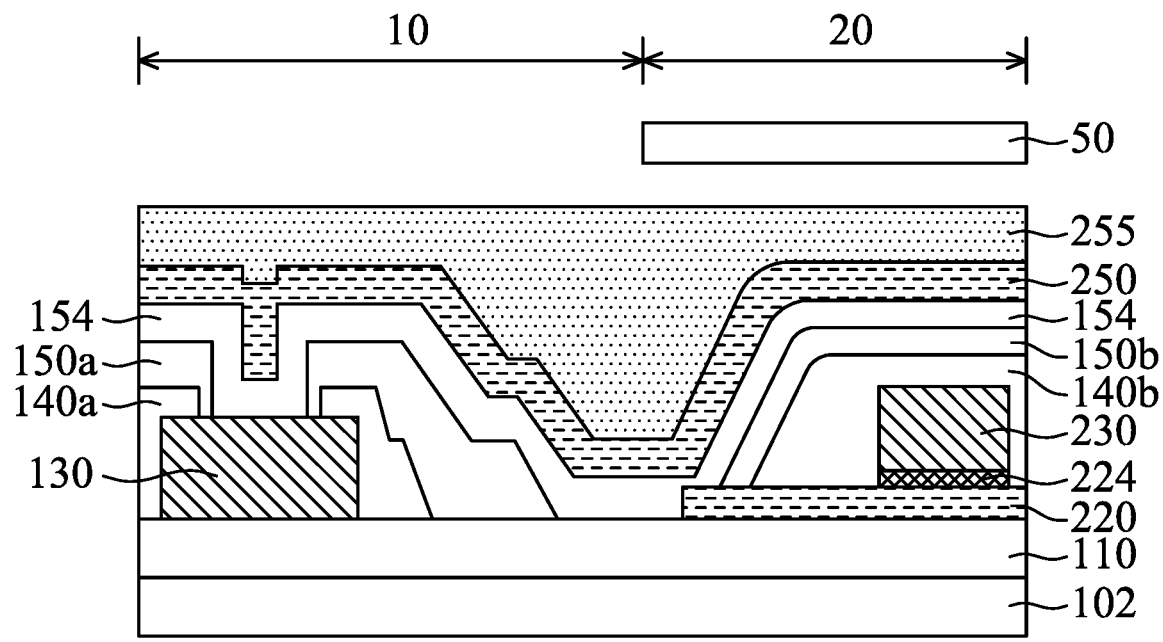

Subsequently, as shown in FIG. 1G, a photoresist layer 255 is formed over the top magnetic layer 250, and a third mask 50 is disposed over the photoresist layer 255, in accordance with some embodiments of the disclosure.

Figure 1H:
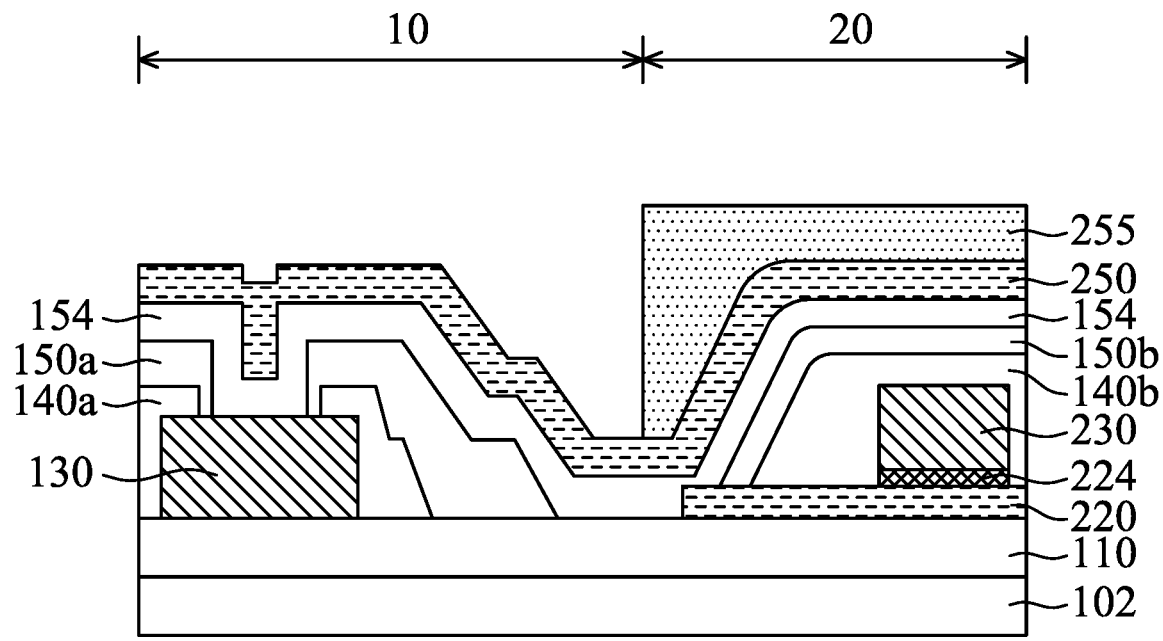

Next, as shown in FIG. 1H, the photoresist layer 255 is patterned by using the third mask 50 as a mask, in accordance with some embodiments of the disclosure. As a result, a portion of the photoresist layer 255 in the first region 10 is removed to form the patterned photoresist layer 255 in the second region 20. More specifically, the patterned photoresist layer 255 is left on the top magnetic layer 250 in the second region 20 to protect the underlying layers from being etched in the following processes. Next, the third mask 50 is removed.

If the thickness of the second insulating layer 150 is too large, a high photoresist layer 255 have to deposited to cover all of the second insulating layer 150. More photoresist layer 255 is deposited, and more photoresist layer 255 in the first region 10 is removed. However, the bottom portion of the photoresist layer 255 may not easily to be removed and may produce some bubbles in the bottom portion. The bubbles come from outgas generated from photoresist material when the photoresist layer is exposed to light.

Figure 1I:
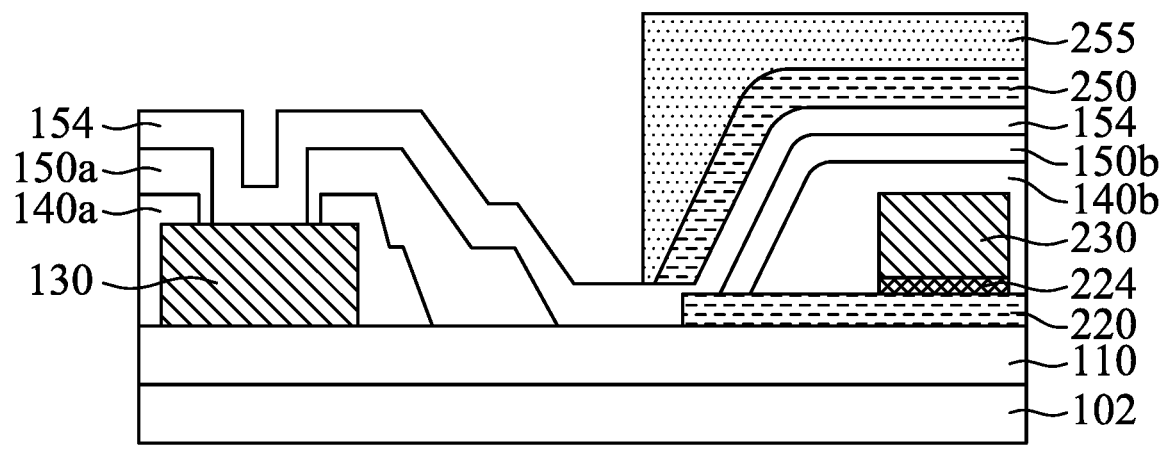

Afterwards, as shown in FIG. 1I, a portion of the top magnetic layer 250 is removed by using the patterned photoresist layer 255 as a mask, in accordance with some embodiments of the disclosure. The exposed portion of the top magnetic layer 250 which is not covered by the patterned photoresist layer 255 is removed by an etching process, such as a wet etching process or a dry etching process.

Figure 1J:
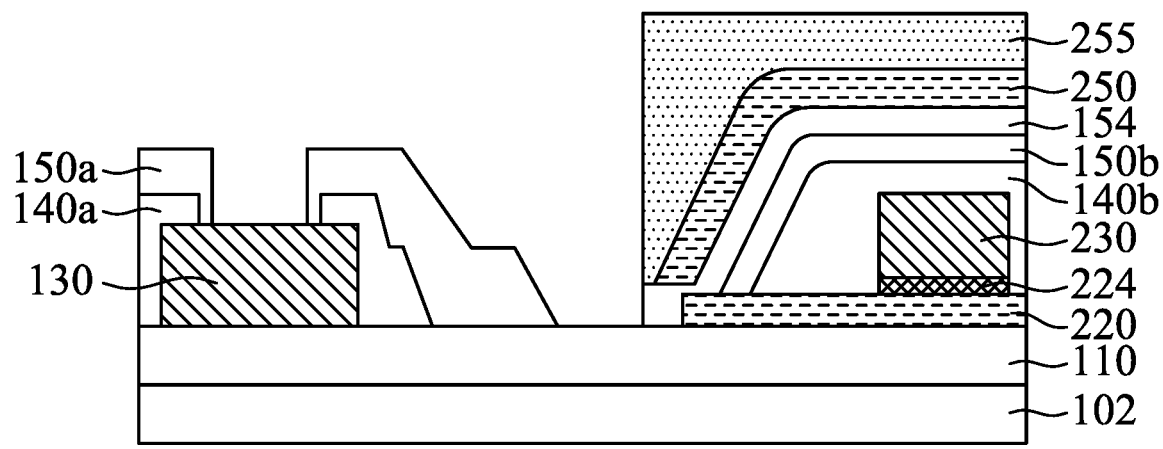

Next, as shown in FIG. 1J, a portion of the second dielectric layer 154 is removed, in accordance with some embodiments of the disclosure. Afterwards, the patterned photoresist layer 255 is removed. After the portion of the second dielectric layer 154 is removed, the first portion 150a of the second insulating layer 150 is exposed. In addition, the top surface of the first conductive structure 130 is exposed.

Figure 1K:
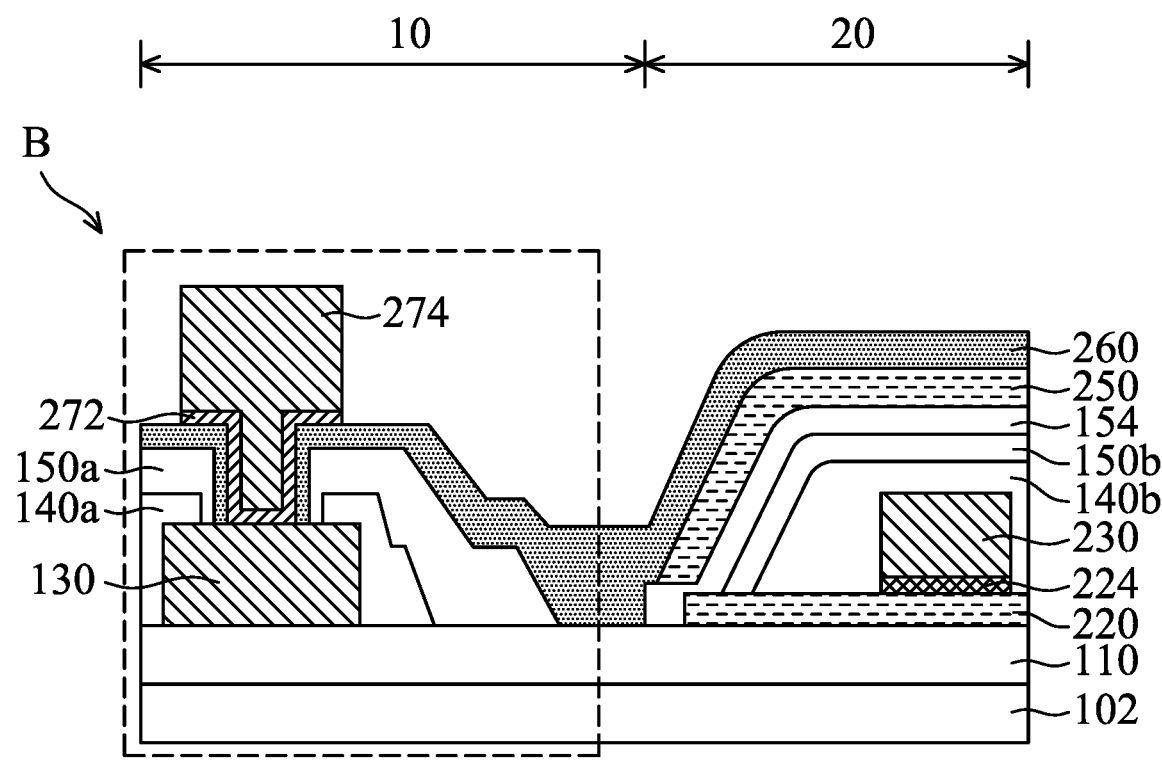

Afterwards, as shown in FIG. 1K, a passivation layer 260 is formed over the top magnetic layer 250, the exposed top surface of the interconnect structure 110, the exposed top surface of the first conductive structure 130, in accordance with some embodiments of the disclosure.

Next, the passivation layer 260 is removed to expose the top surface of the first conductive structure 130. A under bump metallurgy (UBM) layer 272 is formed over the exposed top surface of the first conductive structure 130.

In some embodiments, the passivation layer 260 is made of poly(p-phenylene-2,6-benzoxazole) (PBO), benzocyclobutene (BCB), silicone, acrylates, siloxane, another suitable material, or a combination thereof. In some other embodiments, the passivation layer 260 is made of non-organic materials. The non-organic materials include silicon oxide, un-doped silicate glass, silicon oxynitride, silicon nitride, silicon carbide, HMDS, another suitable material, or a combination thereof. In some embodiments, the passivation layer 260 is formed by a deposition process, such as a physical vapor deposition (PVD) process, a chemical vapor deposition (CVD) process, or another applicable process.

The UBM layer 272 may be made of conductive material, such as copper (Cu), copper alloy, aluminum (Al), aluminum alloy, tungsten (W), tungsten alloy, titanium (Ti), titanium alloy, tantalum (Ta) or tantalum alloy. In addition, the UBM layer 272 may contain an adhesion layer and/or a wetting layer. In some embodiments, the UBM layer 272 further includes a copper seed layer. In some embodiments, the UBM layer 272 includes an adhesion layer made of Ti/Cu and a wetting layer made of Cu. In some embodiments, the UBM layer 272 is formed by a plating process, such as an electrochemical plating process or an electroless process.

Afterwards, a conductive connector structure 274 is formed over the UBM layer 272. The conductive connector structure 274 is formed over the first conductive structure 130. The conductive connector structure 274 is electrically connected to the first conductive structure 130 by the UBM layer 272. In some embodiments, the conductive connector structure 274 is made of a metal layer, such as copper, copper alloy, nickel, nickel alloy, aluminum, aluminum alloy, tin, tin alloy, lead, lead alloy, silver, silver alloy or a combination thereof. In some embodiments, the conductive connector structure 274 is formed by a plating process, such as an electrochemical plating process or an electroless process.

Referring to FIG. 1I again, the portion of the top magnetic layer 250 is removed. It should be noted that, the stress may produce in the second dielectric layer 154 after the portion of the top magnetic layer 250 is removed. The stress may cause crack and delamination problems. If some cracks are formed in the second dielectric layer 154, the cracks may migrate to the second insulating layer 150. The cracks may be formed in the first portion 150a of the second insulating layer 150 or the second portion of the second insulating layer 150. The topography of the second insulating layer 150 may affect the formation of the cracks. If the shape of the first portion 150a of the second insulating layer 150 is too steep (substantially vertical), the risk of formation of cracks in the second insulating layer 150 is high. When too many cracks form in the second insulating layer 150, the second insulating layer 150 may be delaminated from the first insulating layer 140. The stair-shaped sidewall of the first portion 150a of second insulating layer 150 of the disclosure can disperse the stress. Therefore, the specific stair-shaped structure of the sidewall of the first portion 150a of second insulating layer 150 can prevent crack formation and delamination.

Furthermore, if the insulating layer is formed by a one-step deposition process, the insulating layer will have a relatively vertical sidewall due to the height difference between the first conductive structure 130 and the top surface of the interconnect structure. The vertical sidewall of the insulating layer may induce unwanted cracks. Therefore, two insulating layers (140 and 150) of the disclosure are subsequently formed over the first conductive structure 130 to produce the stair-shaped sidewall. The inclined sidewall of the first portion 150a of the second insulating layer 150 can effectively disperse the stress. More specifically, since the stress can be dispersed along the stair-shaped sidewall in different directions. As a result, the stress is reduced. Therefore, the cracks and delamination problems are resolved and the reliability of the semiconductor device structure is improved.

Figure 3:
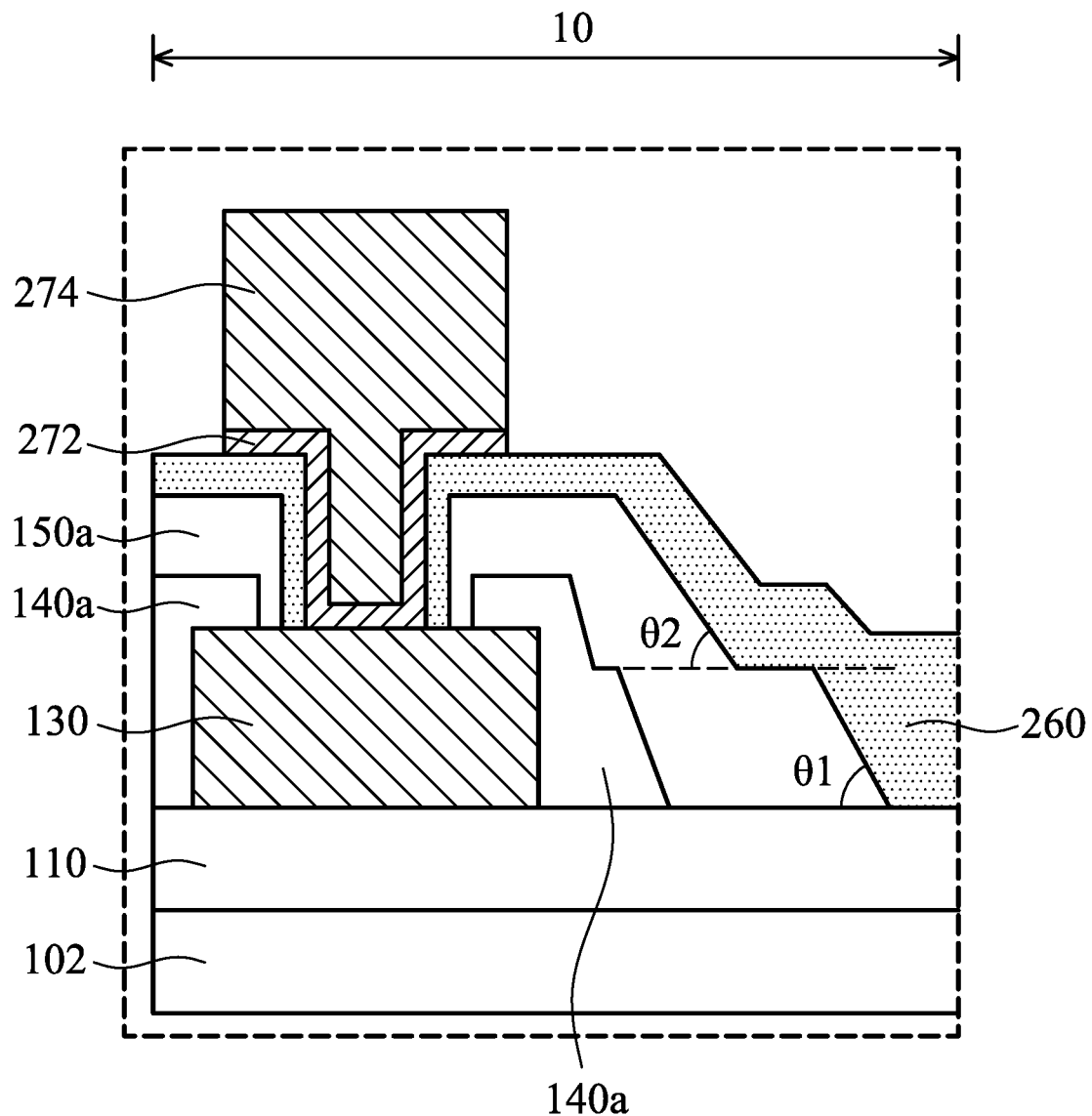
FIG. 3 shows an enlarged cross-sectional representation of the region B of FIG. 1E, in accordance with some embodiments of the disclosure.

FIG. 3 shows an enlarged cross-sectional representation of the region B of FIG. 1E, in accordance with some embodiments of the disclosure.

As shown in FIG. 3, the sidewall of the first portion 150a of the second insulating layer 150 has a bottom portion 152a and a top portion 152b. The bottom portion 152a has a first slope and the top portion 152b has a second slope. The first slope is different than the second slope. The sidewall of the first portion 150a of the second insulating layer 150 has two levels, rather than one level, and therefore the stress may be dispersed to prevent the problem of cracking.

Figure 4:
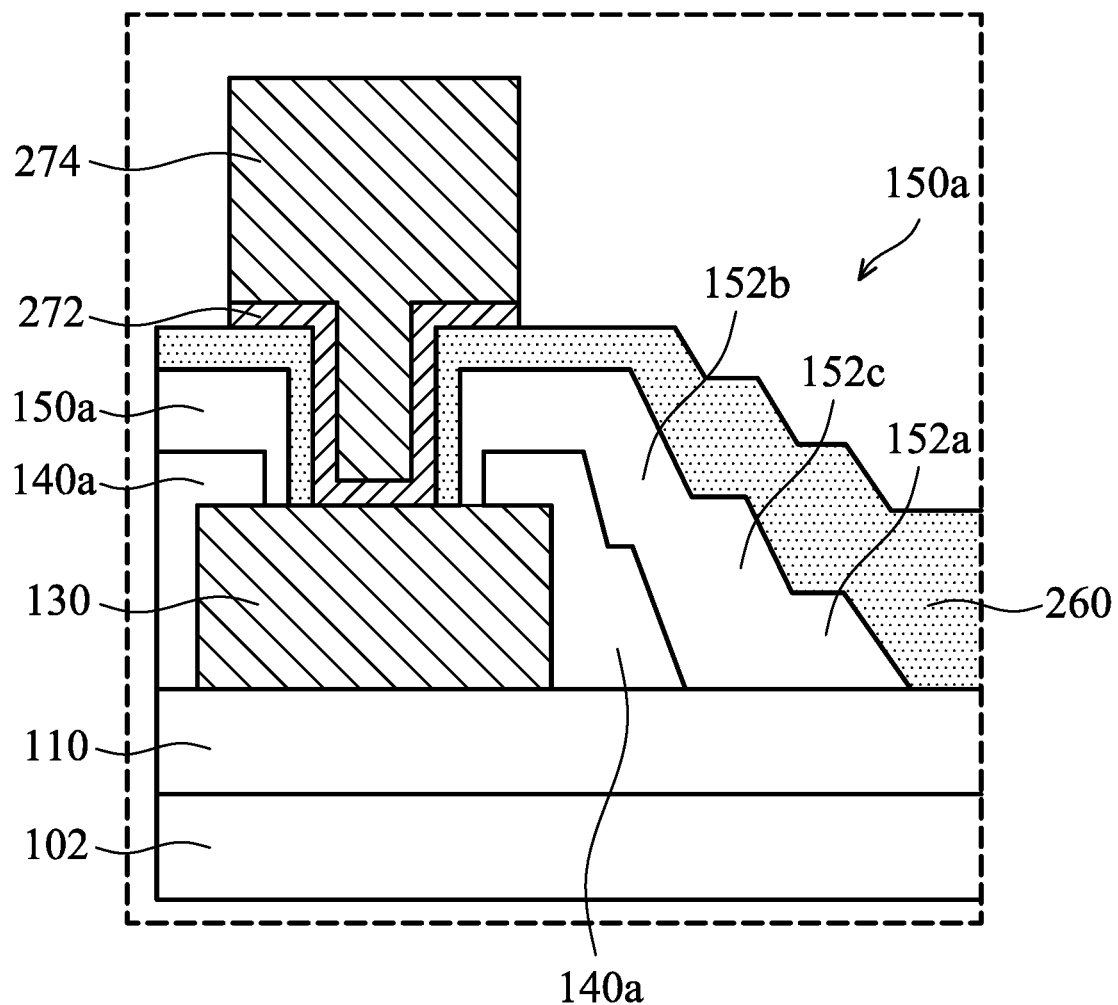
FIG. 4 shows an enlarged cross-sectional representation of a modified structure of FIG. 3, in accordance with some embodiments of the disclosure

FIG. 4 shows an enlarged cross-sectional representation of a modified structure of FIG. 3, in accordance with some embodiments of the disclosure.

As shown in FIG. 4, the sidewall of the first portion 150a of the second insulating layer 150 has a bottom portion 152a, a middle portion 152c and a top portion 152b. The middle portion 152c is between the bottom portion 152a and the top portion 152b. The sidewall of the second insulating layer 150 with multiple levels has the advantage of dispersing the stress to prevent cracks. The number of levels of the sidewall of the second insulating layer 150 should be at least two, not limited to two or three, and it can be adjusted according to actual application. The three portions of the second insulating layer 150 can be designed by controlling the patterns of the second mask 40.

Figure 5:
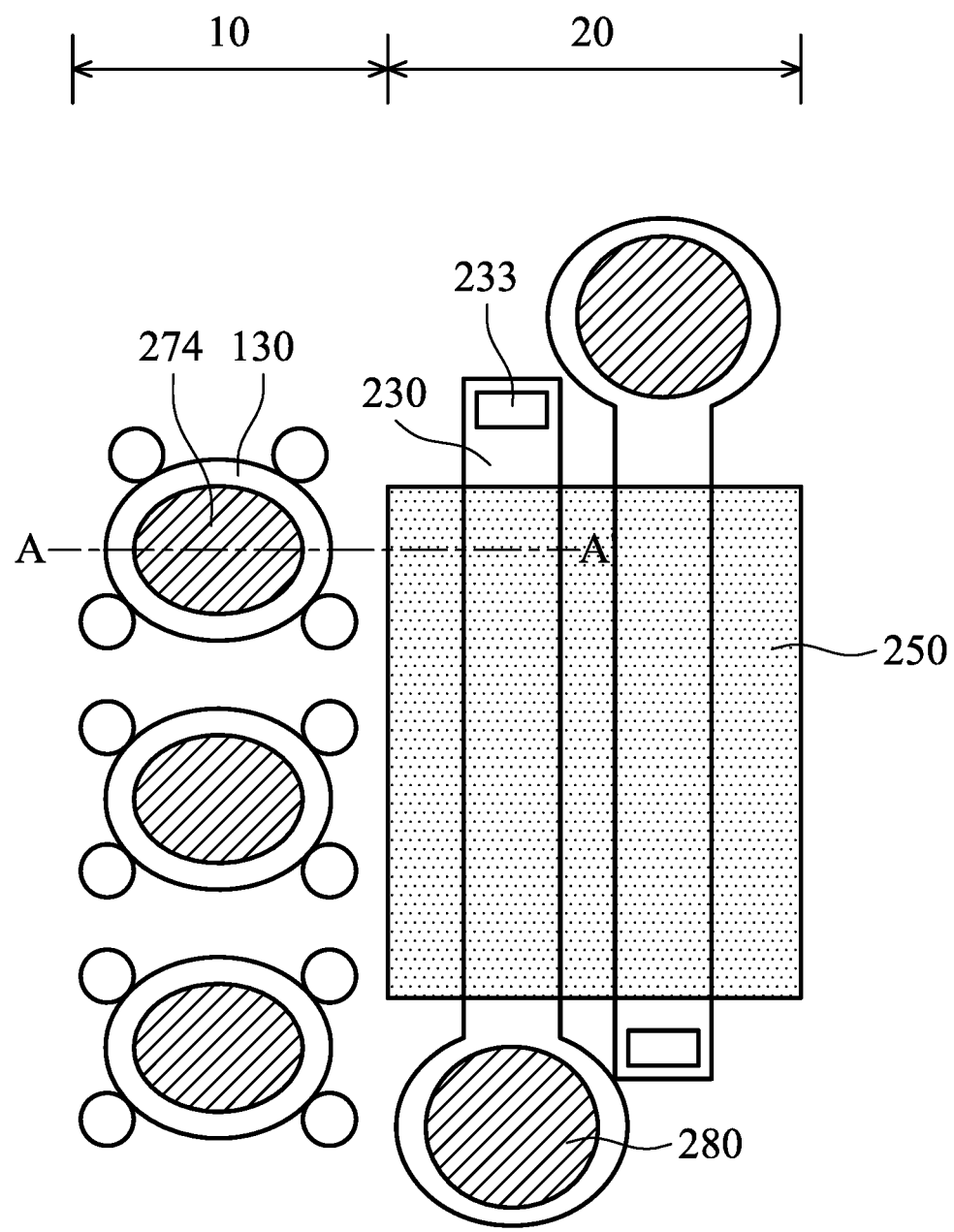
FIG. 5 shows a top-view of the semiconductor device structure, in accordance with some embodiments of the disclosure.

FIG. 5 shows a top-view of the semiconductor device structure, in accordance with some embodiments of the disclosure. FIG. 1K is a cross-sectional representation of the semiconductor device structure taken along A-A' line of FIG. 4, in accordance with some embodiments of the disclosure.

In the first region 10, the conductive connector structure 274 is formed over the first conductive structure 130. The conductive connector structure 274 is configured to transfer the signal to outer environment. In the second region 20, the second conductive structure 230 is covered by the top magnetic layer 250 to form the inductor structure. A via 233 is formed over the second conductive structure 230 and is used to transfer signal to other devices. The second conductive structure 230 is electrically connected to a conductive connector structure 280. The conductive connector structure 280 is configured to transfer the signal to outer environment. The conductive connector structure 280 is not covered by the top magnetic layer 250. The method for forming the conductive connector structure 28 is similar to the method for forming the conductive connector structure 274.

Embodiments for forming a semiconductor device structure and method for forming the same are provided. The semiconductor device structure is an inductor structure. The inductor structure includes an electrical conductor encircled by the magnetic materials. The electrical conductor is a conductive structure, and the magnetic materials are constructed by the top magnetic layer and the bottom magnetic layer. A first insulating layer and a second insulating layer are sequentially formed over a first conductive structure and a second conductive structure. The second insulating layer has a stair-shaped structure to disperse the stress, and therefore the problems of cracking and delamination are solved. Therefore, the performance and reliability of the semiconductor device structure is improved.

In some embodiments, a semiconductor device structure is provided. The semiconductor device structure includes a substrate, and the substrate includes a first region and a second region. The semiconductor device structure includes a first conductive structure formed over the first region of the substrate and a bottom magnetic layer formed over the second region of the substrate. The semiconductor device structure also includes a second conductive structure formed over the bottom magnetic layer and a first insulating layer formed over a sidewall surface of the first conductive structure. The semiconductor device structure further includes a second insulating layer formed over the first insulating layer, and the second insulating layer has a stair-shaped structure.

In some embodiments, a semiconductor device structure is provided. The semiconductor device structure includes a first conductive structure formed over the first region of the substrate and a second conductive structure formed over the second region of the substrate. The semiconductor device structure also includes a first insulating layer formed over the first conductive structure and the second conductive structure. The first insulating layer includes a first portion over the first conductive structure and a second portion formed over the second conductive structure, and the first portion and the second portion are discrete. The semiconductor device structure further includes a second insulating layer formed over the first insulating layer. The second insulating layer includes a first portion over the first conductive structure and a second portion formed over the second conductive structure, the first portion and the second portion are discrete, and the first portion of the second insulating layer has a stair-shaped structure. The semiconductor device structure includes a top magnetic layer formed over the second portion of the second insulating layer, and the top magnetic layer is formed on the second insulating layer.

In some embodiments, a method for forming a semiconductor device structure is provided. The method includes forming a bottom magnetic layer over a second region of a substrate and forming a second conductive structure over the bottom magnetic layer. The method also includes forming a first conductive structure over a first region of the substrate and forming a first insulating layer over the first conductive structure and a second conductive structure. The method further includes forming a second insulating layer over the first insulating layer, and the second insulating has a stair-shaped structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate;
    a first conductive structure formed over the substrate;
    a bottom magnetic layer formed over the substrate, wherein the bottom magnetic layer is apart from the first conductive structure;
    a second conductive structure formed over the bottom magnetic layer;
    a first insulating layer formed over a sidewall surface of the first conductive structure;
    a second insulating layer formed over the first insulating layer, wherein the second insulating layer has a stair-shaped structure, wherein the first insulating layer has a portion in direct contact with a top surface of the second conductive structure and a top surface of the bottom magnetic layer; and
    a top magnetic layer formed over the second conductive structure and the second insulating layer, wherein the top magnetic layer has a top portion and a sloped sidewall portion, and the bottom magnetic layer is insulated from the sloped sidewall portion of the top magnetic layer.

2. The semiconductor device structure as claimed in claim 1, further comprising:
    a first dielectric layer formed over the bottom magnetic layer, wherein the second conductive structure is insulated from the bottom magnetic layer by the first dielectric layer.

3. The semiconductor device structure as claimed in claim 1,
    wherein the second conductive structure is surrounded by the bottom magnetic layer and the top magnetic layer.

4. The semiconductor device structure as claimed in claim 3, further comprising:
    a second dielectric layer formed over the second insulating layer, wherein the second dielectric layer is between the second insulating layer and the top magnetic layer.

5. The semiconductor device structure as claimed in claim 1, wherein a sidewall of the second insulating layer comprises a bottom portion and a top portion, the bottom portion has a first height, the first conductive structure has a second height, a ratio of the first height to the second height is in a range from about 1/3 to about 1/2.

6. The semiconductor device structure as claimed in claim 5, wherein the bottom portion of the second insulating layer has a substantially planar top surface.

7. The semiconductor device structure as claimed in claim 1, wherein the second insulating layer is made of polybenzoxazole (PBO), benzocyclobutene (BCB), polyimides (PI), silicone, acrylates, siloxane, or a combination thereof.

8. The semiconductor device structure as claimed in claim 1, further comprising:
    a conductive connector structure formed over the first conductive structure and in the second insulating layer, wherein the conductive connector structure is electrically connected to the first conductive structure.

9. A semiconductor device structure, comprising:
    a substrate;
    a first conductive structure formed over a first region of the substrate;
    a bottom magnetic layer formed over a second region of the substrate;
    a second conductive structure formed over the bottom magnetic layer;
    a first insulating layer formed over the first conductive structure and the second conductive structure, wherein the first insulating layer comprises a first portion over the first conductive structure and a second portion formed over the second conductive structure, and the first portion and the second portion are discrete;
    a second insulating layer formed over the first insulating layer, wherein the second insulating layer comprises a first portion over the first conductive structure and a second portion formed over the second conductive structure, the first portion and the second portion are discrete, and the first portion of the second insulating layer has a stair-shaped structure; and
    a top magnetic layer formed over the second portion of the second insulating layer, wherein the top magnetic layer is formed on the second insulating layer, wherein an outer sidewall of the top magnetic layer is laterally away from an outer sidewall of the bottom magnetic layer, and the top magnetic layer is insulated from the bottom magnetic layer.

10. The semiconductor device structure as claimed in claim 9, wherein the second conductive structure is surrounded by the bottom magnetic layer and the top magnetic layer.

11. The semiconductor device structure as claimed in claim 10, further comprising:
    a first dielectric layer formed over the bottom magnetic layer, wherein the bottom magnetic layer is isolated from the second conductive structure by the first dielectric layer.

12. The semiconductor device structure as claimed in claim 11, further comprising:
   a second dielectric layer formed over the second insulating layer, wherein the second dielectric layer is between the second insulating layer and the top magnetic layer.

13. The semiconductor device structure as claimed in claim 9, wherein the second insulating layer comprises a bottom portion and a top portion, the bottom portion has a first height, the first conductive structure has a second height, a ratio of the first height to the second height is in a range from about 1/3 to about 1/2.

14. The semiconductor device structure as claimed in claim 13, wherein there is an interface between the first insulating layer and the second insulating layer, and the interface has a stair shape.

15. The semiconductor device structure as claimed in claim 14, further comprising:
   a conductive connector structure formed in the second insulating layer and over the first conductive structure, wherein the conductive connector structure is electrically connected to the first conductive structure.

16. A method for forming a semiconductor device structure, comprising:
   forming a first conductive structure over a first region of a substrate;
   forming a bottom magnetic layer over a second region of the substrate, wherein a top surface of the first conductive structure is higher than a top surface of the bottom magnetic layer;
   forming a second conductive structure over the bottom magnetic layer;
   forming a first insulating layer over the first conductive structure and the second conductive structure;
   forming a second insulating layer over the first insulating layer, wherein the second insulating layer has a stair-shaped structure forming a first dielectric layer over the second insulating layer; and
   forming a top magnetic layer over the first dielectric layer, wherein the first dielectric layer is in direct contact with the second insulating layer and the top magnetic layer.

17. The semiconductor device structure as claimed in claim 16, further comprising:
   forming a passivation layer over the second insulating layer; and
   forming a conductive connector structure in the passivation layer, wherein the conductive connector structure is formed over the first conductive structure and is electrically connected to the first conductive structure.

18. The semiconductor device structure as claimed in claim 16,
   wherein the second conductive structure is surrounded by the bottom magnetic layer and the top magnetic layer.

19. The method for forming the semiconductor device structure as claimed in claim 18, further comprising:
   forming a second dielectric layer over the bottom magnetic layer, wherein the second conductive structure is insulated from the bottom magnetic layer by the second dielectric layer.

20. The method for forming the semiconductor device structure as claimed in claim 19,
   wherein the first dielectric layer is between the second insulating layer and the top magnetic layer.

* * * * *